United States Patent [19]

Ono

[11] Patent Number: 4,688,147

[45] Date of Patent: Aug. 18, 1987

[54] COOLING DEVICE ATTACHED TO EACH SURFACE OF ELECTRONIC PARTS ON A PRINTED-WIRING BOARD

[75] Inventor: Izumi Ono, Hachioji, Japan

[73] Assignee: Fujitsu Limited, Kawasaki, Japan

[21] Appl. No.: 909,229

[22] Filed: Sep. 19, 1986

[30] Foreign Application Priority Data

Sep. 20, 1985 [JP] Japan .................................. 60-208203

[51] Int. Cl.⁴ .............................................. H02B 1/00
[52] U.S. Cl. ................................... 361/385; 361/381;
200/289
[58] Field of Search ............... 361/385, 381, 382, 384,
361/379; 200/289

[56] References Cited

FOREIGN PATENT DOCUMENTS 0001123 9/1978 European Pat. Off. .
0006445 5/1979 European Pat. Off. .
0151068 1/1985 European Pat. Off. .

OTHER PUBLICATIONS

IBM Technical Disclosure Bulletin, Device Cooling, by A. H. Johnson, vol. 20, No. 10, Mar. 1978.
IBM Technical Disclosure Bulletin, Liquid Cooling of a Multichip Module Package, by D. Balderes et al., vol. 20, No. 11A, Apr. 1, 1978.
IBM Technical Disclosure Bulletin, vol. 20, No. 5, Oct. 1977, pp. 1769–1771, Armonk, N.Y., US; B. T. Clark et al.: "Cooling Device for Multilayer Ceramic Modules".
IBM Technical Disclosure Bulletin, vol. 21, No. 8, Jan. 1979, pp. 3281–3282, Armonk, N.Y., US; Moran: "Self-regulating Evaporative/Conductive Thermal Link".
IBM Technical Disclosure Bulletin, vol. 20, No. 10, Mar. 1978, pp. 3893–3894, Armonk, N.Y., US; Hwang et al.: "Thermal Flexible Piston Module".

Primary Examiner—Robert S. Macon
Attorney, Agent, or Firm—Staas & Halsey

[57] ABSTRACT

A cooling device located between a cooling plate having a first coolant circulating therein, and an electronic part to be cooled, mounted on a printed-wiring board, comprising a hollow part being thermally conductive, having a hollow chamber through which the first coolant circulates, and connected to the cooling plate by a flange part being thermally conductive, a thermal conduction plate attached to a surface of the electronic part and connected to the flange part by a bellows providing a space among the hollow part, the bellows and the thermal conduction plate, and a second liquid coolant filling the space for transferring heat from the thermal conduction plate to the hollow part by a convection current of the second coolant. The second coolant is made of alloy being chemically inactive to the bellows and having a low melting point so as to be liquid at ordinary temperatures.

13 Claims, 3 Drawing Figures

COOLING DEVICE ATTACHED TO EACH SURFACE OF ELECTRONIC PARTS ON A PRINTED-WIRING BOARD

BACKGROUND OF THE INVENTION

The present invention relates to a cooling device which is located between a cooling plate and an electronic part mounted on a printed-wiring board and cools the electronic part using a first coolant which circulates in the cooling plate through the cooling device, particularly it relates to a cooling device which improves reliability of cooling operation of the cooling device by filling second coolant of a liquid type into a bellows of the cooling device.

Recently, high density packaging and high speed operation are required to electronic parts such as Large Scaled Integrated circuit (LSI) elements widely applied to electronic apparatus, so that temperature of electronic parts tends to rise increasingly. Therefore, it becomes very important that electronic parts are cooled in high efficiency to obtain stable operation of the electronic parts.

When the electronic parts are mounted on a printed-wiring board, in a prior art cooling device using a circulating coolant for transferring heat produced in the electronic parts, it is well known that cooling water is economic and effective as the coolant. FIG. 1 is a perspective view of the prior art cooling device.

In FIG. 1, a cooling plate 3 is provided in such a way as being stacked as indicated by an arrow mark F on a printed-wiring board 1 on which a plurality of electronic parts 2 are mounted. A bellows 5 engaged with the predetermined surface of the cooling plate 3 presses a surface of the electronic part 2, and cooled water is capable of circulating in the direction of an arrow mark A from the one opening 10 of the cooling plate 3 and in the direction of the arrow mark B from the other opening 100, thereby cooling the electronic parts 2.

The extruding height of the electronic part 2 from the printed-wiring board 1 is not always equal to the specified value. Therefore, in view of absorbing "dispersion" of extruding heights of the electronic parts 2, a flexible bellows 5 is provided between the surfaces of the cooling plate 3 and the electronic part 2 and the bellows 5 is placed in certified close contact with the surfaces keeping a pressure not giving adverse effect on respective electronic part 2.

Therefore, the bellows 5 is formed using a very thin sheet made of copper or stainless steel so that the bellows 5 may be damaged if rusted after use for a long period of time.

Accordingly, extended duration of bellows has been expected in order to assure stabilized cooling effect for long time operation.

FIG. 2 is a cross-sectional view of a prior art cooling device. As shown in FIG. 2, cooling structure of the prior art cooling device comprises a flange 11 attached to a cooling plate 3 through an O-ring 13, a thermal conduction plate 4 attached with pressure to the electronic part 2 through a thermal conduction sheet 12 and the bellows 5 which combines the flange 11 and the thermal conduction plate 4.

A coolant 9 flowing in the direction of arrow mark A1 passing through the one circulating path 3A of the cooling plate 3 is injected in the direction of arrow mark A2 from a nozzle 3B provided on the cooling plate 3, moreover it is caused to flow in the direction of arrow mark A3 into the other circulating path 3A, thereby cooling the electronic part 2 through the thermal conduction plate 4 and the thermal conduction sheet 12.

The bellow 5 is provided in the cooling device for making thermal conduction and pressure contact appearing and performed between the electronic part 2 and the thermal conduction plate 4 high and tightly respectively. Accordingly, the bellows 5 is made of very thin sheet, such as 80 microns, of copper or stainless steel using a spring nature of the sheet.

However, this structure results in such a problem if the coolant 9 circulates for a long time that the bellows 5 may be rusted, so that the coolant 9 leaks out from the bellows 5 and thereby electronic part 2 will be damaged.

Moreover, there arises a problem that when flow rate of the coolant 9 is required to be increased in order to raise the cooling capability, an increased pressure due to the flow rate is applied to the surface of electronic part and thereby the thermal conduction plate 4 may be broken.

SUMMARY OF THE INVENTION

Therefore, an object of the present invention is to improve the prior art cooling device so that the bellows is not rusted by the coolant-circulating from the cooling plate.

Another object of the present invention is to improve the prior art cooling device so that an electronic part is not damaged by the pressure applied from a part of cooling device due to increased pressure of coolant even in case the flow rate of circulating coolant is increased.

Further object of the present invention is to stabilize the operation of the cooling device and extend the operation life of the device.

Above objects of the present invention can be attained by providing a hollow part inside of the bellows. The hollow part has a hollow chamber opened to the circulating path in the cooling plate so as to circulate the coolant of the cooling plate through the hollow chamber. The coolant of the cooling plate (called the first coolant) flows into the hollow chamber for cooling the hollow part. The hollow chamber is perfectly separated from the exterior of hollow part so that the first coolant does not leak out from the hollow part. The space between the hollow part and bellows is filled with another coolant (called the second coolant) so that the electronic part can be cooled by convection of the second coolant cooled by the hollow part.

Accordingly, metal rust which has produced in the prior art can be prevented and the operation life of the cooling device can be extended by using a liquid which does not result in metal corrosion as the second coolant and moreover since influence on the electronic part by the flowing pressure of the first coolant can be eliminated, flow rate can be increased and the cooling capability can also be improved.

DESCRIPTION OF THE PREFERRED EMBODIMENT

Figure 1:
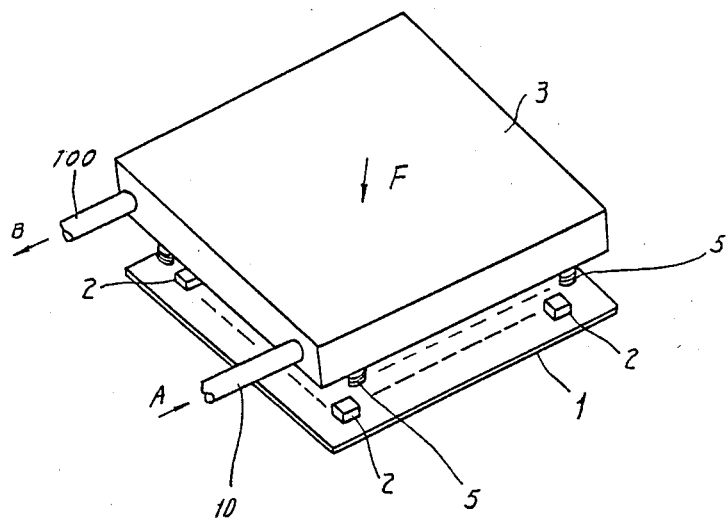
FIG. 1, is a perspective illustration indicating the working condition of a cooling device incorporated with the present invention.
Figure 2:
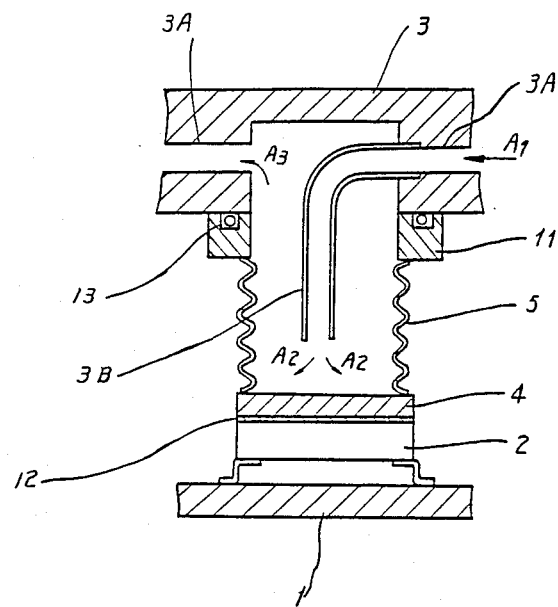
FIG. 2 is a schematic vertical sectional view of a cooling device of the prior art.
Figure 3:
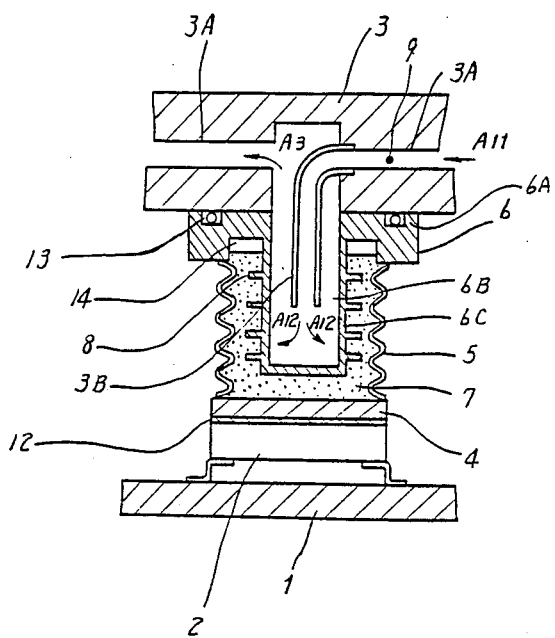
FIG. 3 is a schematic vertical sectional view of an embodiment of the present invention.

The present invention is explained in detail with reference to FIG. 3, which is a vertical sectional view of an embodiment of the present invention. In FIG. 3, the same reference numerals as those in FIGS. 1 and 2 designate the similar parts to those in FIGS. 1 and 2.

In the embodiment, a coolding device loaded between the cooling plate 3 and the electronic part 2 comprises a block 6 comprising a flange 6A and a hollow part 6c, a bellows 5, a hollow part 6C and a second coolant 7 filling the space provided in the interior of the bellows 5. The flange 6A is attached to the cooling plate 3 through an O-ring 13. The hollow part 6C has a hollow chamber 6B through which the first coolant 9 circulates and the external side thereof is in contact with the second coolant 7. The thermal conduction plate 4 is in contact with the surface of the electronic part 2 through the thermal conduction sheet 12.

The block 6 and the thermal conduction plate 4 are made of copper when these are formed thick or made of stainless steel when these are formed thin. Since an ordinary water is used as the first coolant 9, when the block 6 is formed with copper, particular rust preventing processing is not required for the surface which is in contact with the first coolant 9. However, the surface which is in contact with the second coolant 7 requires the surface processing such as coating of Teflon in order to avoid chemical variations caused by the copper and second coolant 7. Also in the case of forming the thermal conduction plate 4 with copper, the surface processing is necessary for the surface to be in contact with the second coolant 7. When the block 6 and thermal conduction plate 4 are formed by stainless steel, such surface processings are no longer necessary.

As described in the prior art, the bellows 5 is formed by very thin metal material, for example, as thin as 80 microns, in order to have a very delicate spring force which presses the electronic part 2 to the cooling device but does not give any damage thereto. Therefore, when the Teflon coating is carried out as described above, flexibility is lost and when thin Teflon coating is executed, the coating easily damaged. In any case, the Teflon coating results in various disadvanages. Accordingly, stainless steel or nickel material which does not generate rust with the second coolant 7 is used as the raw material.

The second coolant 7 is preferably liquid for the purpose that the thermal conduction plate 4 is closely placed in contact with the surface of electronic part 2 through a thermal conduction sheet 12, raised heat of electronic part 2 is transferred to the second coolant 7 and moreover it is effectively transferred to the first coolant.

The thermal conduction sheet 12 is provided for absorbing difference of parallelism between the surface of electronic part 12 and the thermal conduction plate 4 fixed to the bellows 5 and assuring close contact and is usually composed of a flexible good thermal conduction member, for example, BFG-20 or BFG-30 manufactured by DENKA chemical Industrial Corp.

However, since it is difficult from the point of view of manufacture to fill the bellows 5 with liquid, it is preferable to use a low melting point metal, for example, the INDALLOY Number 51 or 60 of INDIUM CORP. OF AMERICA which is in a solid at a low temperature when cooling is not required and in a liquid at a high temperature when cooling is required and is formed by the alloy of gallium (Ga), indium (In), tin (Sn) and is fused within temperature ranging from 5° C. to 50° C.

When a fin 8 is provided to the external or internal circumference of the hollow part 6C (to the external circumference in FIG. 3), the heat exchange area respectively for the first and second coolants 9 and 7 can be increased and thermal conduction efficiency can be raised.

Because of such structure and temperature rise of electronic part 2, heat produced from the electronic part 2 is transferred to the second coolant 7 through the thermal conduction sheet 12 and thermal conduction plate 4 and thereby the second coolant 7 is fused. Next, heat is transferred to the first coolant 9 through the hollow part 6C by a convection current of the fused second coolant 7.

The first coolant 9 is caused to flow into the nozzle 3B from the one circulating path 3A of the cooling plate 3 as indicated by an arrow mark A11, the first coolant 1 is then injected to the hollow chamber 6B from the nozzle 3B as indicated by an arrow mark A12 and moreover the injected second coolant 9 is caused to flow to the other circulating path 3A as indicated by an arrow mark A13.

In this case, since the injected first coolant 9 is received by the hollow part 6C, even when the flow rate is increased, flowing pressure is not applied directly on the bellows 5 and it does not press the surface of electronic part 2.

As a result, the flow rate can be increased easily. In addition, since rusting of metal dose not occur on the thin bellows 5, the bellows 5 is now free from damage due to metal rusting.

As explained above, according to the present invention, damage by metal rusting of the bellows can be prevented and thereby reliability of bellows can be improved so as to obtain a longer operation life.

Moreover, since the contact pressure at the surface of the electronic part is not influenced by variations of flow rate of the first coolant, a specified contact pressure can always be maintained, assuring stabilized cooling and allowing increase in flow rate of the first coolant, namely resulting in such a large practical effect that the cooling capability can be enhanced by increase of flow rate.

I claim:
1. A cooling device located between a cooling plate and an electronic part to be cooled, mounted on a printed-wiring board, for transferring heat raised in the electronic part to the cooling plate using a first coolant which circulates in the cooling plate and said cooling device through a hole provided on a surface of the cooling plate, said cooling device comprising:
   hollow means being thermally conductive, having a hollow chamber for allowing the first coolant circulating through said hollow chamber avoiding the first coolant flowing out from said hollow chamber;
   connection means being thermally conductive, for connecting said hollow means to the surface of the cooling plate, opening the hole on the surface of the cooling plate to said hollow chamber;
   thermal conduction means attached to a surface of the electronic part;
   bellows means for connecting said thermal conduction means to said connection means providing a space between said hollow means and said bellows means and between said hollow means and said thermal conduction means, and pressing said thermal conduction means to the surface of the electronic part and a second coolant being liquid at ordinary temperatures and chemically inactive to said bellows and filling into said space, for transferring heat from said thermal conduction means to said hollow means by a convection current of said second coolant.

2. A cooling device located between a cooling plate and an electronic part to be cooled, mounted on a printed-wiring board, for transferring heat raised in the electronic part to the cooling plate using a first coolant which circulates in the cooling plate and said cooling device through a hole provided on a surface of the cooling plate, said cooling device comprising:
 a block part comprising:
  a hollow part being thermally conductive, having a hollow chamber for circulating the first coolant therethrough and for avoiding the first coolant flowing out therefrom; and
  a flange part being thermally conductive, for connecting said hollow part to the surface of the cooling plate, opening the hole on the surface of the cooling plate to said hollow chamber;
 a thermal conduction plate attached to a surface of the electronic part;
 a bellows for connecting said flange part to said thermal conduction part providing a space between said hollow part and said bellows and between said hollow part and said thermal conduction plate, and pressing the surface of the electronic part; and
 a second coolant being liquid at ordinary temperatures and chemically inactive to said bellows and filling into said space, for transferring heat from said thermal conduction plate to said hollow part by a convection current of said second coolant.

3. A cooling device according to claim 2, wherein said block part further comprises an O-ring which is inserted into a joint of the cooling plate and said flange part for avoiding the first coolant leaking out from the joint.

4. A cooling device according to claim 3, wherein said O-ring is made of rubber.

5. A cooling device according to claim 2, wherein said hollow part comprises a plurality of fins for raising efficiency of heat exchange performed between the first coolant and said second coolant.

6. A cooling device according to claim 2, wherein said block part is made of copper except said O-ring, having coating on a surface which faces to said second coolant, said coating being chemically inactive to said second coolant.

7. A cooling device according to claim 6, wherein said coating is Teflon coating.

8. A cooling device according to claim 2, wherein said block part is made of stainless steel except said O-ring.

9. A cooling device according to claim 2, wherein said bellows made of stainless steel.

10. A cooling device according to claim 2, wherein said bellows made of nickel.

11. A cooling device according to claim 2, wherein said second coolant comprises an alloy having a low melting point ranging from 5 to 50 degrees Centigrade.

12. A cooling device according to claim 11, wherein said alloy is made of gallium and indium.

13. A cooling device according to claim 11, wherein said alloy is made of gallium, indium and tin.

* * * * *

UNITED STATES PATENT AND TRADEMARK OFFICE
CERTIFICATE OF CORRECTION

PATENT NO. : 4,688,147
DATED : AUGUST 18, 1987
INVENTOR(S) : IZUMI ONO

It is certified that error appears in the above-identified patent and that said Letters Patent is hereby corrected as shown below:

Col. 3, line 9, "coolding" should be --cooling--;

Col. 3, line 45, "disadvanages" should be --disadvantages--;

Col. 3, line 62, "chemical" should be --Chemical--.

Col. 4, line 32, "dose" should be --does--.

Signed and Sealed this

Second Day of February, 1988

Attest:

DONALD J. QUIGG

Attesting Officer

Commissioner of Patents and Trademarks